United States Patent [19]
Niijima et al.

[11] Patent Number: 5,546,402
[45] Date of Patent: Aug. 13, 1996

[54] FLASH-ERASE-TYPE NONVOLATILE SEMICONDUCTOR STORAGE DEVICE

[75] Inventors: Hideto Niijima, Tokyo; Takashi Toyooka, Sayama; Akashi Satoh, Kamifukuoka; Yoshinori Sakaue, Tokyo, all of Japan

[73] Assignee: International Business Machines Corporation, Armonk, N.Y.

[21] Appl. No.: 475,524

[22] Filed: Jun. 7, 1995

Related U.S. Application Data

[62] Division of Ser. No. 119,916, Sep. 10, 1993, Pat. No. 5,509,018.

[30] Foreign Application Priority Data

Sep. 11, 1992 [JP] Japan .................................. 4-243118

[51] Int. Cl.⁶ .......................... G11C 29/00; G11C 11/34
[52] U.S. Cl. .................. 371/10.2; 371/40.1; 371/40.4; 365/185.09; 365/185.11; 365/185.17; 365/185.27
[58] Field of Search ................................. 371/10.1, 10.2, 371/40.1, 40.2, 40.4; 365/218, 185, 230.02, 230.06, 231

[56] References Cited

U.S. PATENT DOCUMENTS

| | | | |
|---|---|---|---|
| 4,698,787 | 10/1987 | Mukherjee et al. | 365/185.29 |
| 4,949,309 | 8/1990 | Rao | 365/185.12 |
| 5,185,718 | 2/1993 | Rinerson et al. | 365/185 |
| 5,200,959 | 4/1995 | Gross et al. | 371/21.6 |
| 5,268,870 | 12/1993 | Harari | 365/185.09 |
| 5,270,980 | 12/1993 | Pathal et al. | 365/185.12 |
| 5,278,793 | 1/1994 | Yeh | 365/200 |
| 5,297,148 | 3/1994 | Harari et al. | 371/10.2 |
| 5,392,253 | 2/1995 | Atsumi | 365/230.06 |

FOREIGN PATENT DOCUMENTS

| | | |
|---|---|---|
| 268194 | 11/1988 | Japan . |
| 2292798 | 4/1990 | Japan . |

*Primary Examiner*—Paul P. Gordon
*Attorney, Agent, or Firm*—Shawn B. Dempster; Karuna Ojanen

[57] ABSTRACT

An array of memory cells is physically divided into a data area and a tag area so that respective parts of the two areas share a word line but can be separately erased en bloc. The data area and tag area sharing one word line constitute a single logical unit. In the logical unit, the tag area stores location information for defective memory cells in the corresponding data area. On the basis of this information, the system avoids the use of the defective memory cells. The defective memory cell information is programmed in a test step performed after chip manufacture and, at the same time, ECCs are generated for the defective memory cell information and written to the tag area. Furthermore, the system is informed of the invalidity of the data area that shares a word line with a tag area by writing predetermined data to the tag area. Even when the data area is erased en bloc, the tag area is not erased and the defective memory cell information is retained there.

3 Claims, 10 Drawing Sheets

FIG. I

FLASH-ERASE-TYPE NONVOLATILE SEMICONDUCTOR STORAGE DEVICE

This is a Division of Ser. No. 119,916 filed Sep. 10, 1993, now U.S. Pat. No. 5,509,018 issued Apr. 16, 1996 which is incorporated herein by reference.

FIELD OF THE INVENTION

The present invention relates to nonvolatile semiconductor storage devices with a flash erase capability such as flash memory and, more specifically, to internally redundant architecture. The invention further relates to an external storage system using such a semiconductor storage device.

BACKGROUND OF THE INVENTION

With the spread of portage personal computers such as notebook-type PCs, computer systems are increasingly required to be small and light, and to have low power consumption. Since external storage systems using a semiconductor memory do not need a mechanical drive system as is required in magnetic disk devices, they can operate with low power consumption and at high speed. Further, since such external storage systems are constituted in the form of small memory modules, they are smaller and lighter than magnetic disks, a large degree of freedom can be exercised in determining their shape, and they can easily be implemented in a card form. A flash memory with an en-block erase capability (also called a flash EEPROM) has been developed as a memory suitable for such applications. An outline of this type of flash memory is described in Richard D. Pashley et al., "Flash memories: the best of two worlds," IEEE Spectrum, December 1989, pp 30–33.

As in the case of the DRAM, in a flash memory, a memory element (i.e., memory cell) of 1 bit consists of one transistor. There, the flash memory can be highly integrated, and is expected to have a bit price the same as or lower than that of the DRAM, depending on the future market, which means that it will be a low-cost, large-capacity memory. Since the memory element is nonvolatile, battery backup is not needed. However, the programming of memory bits is performed on a one-way basis only; that is, all changes must be either 0 to 1 or 1 to 0. In order to change a bit value in the opposite direction, all the bit values of a memory block must be made 0 or 1 by en-bloc erasure, which requires a special procedure such as a verify operation.

It may be incidentally mentioned that a conventional flash memory is required to have random access capability in order to be compatible with normal ROM. To this end, like DRAM and other types of memory, the conventional flash memory employs, as a measure for avoiding the use of defective memory cells in a chip, a redundant circuit for replacing, by the use of an address conversion circuit, an entire word line or bit line associated with a defective memory cell with another word line or bit line. This architecture can provide high-speed processing because all address conversion is performed by hardware within the chip. Therefore, this technique is indispensable in memory chips in which random access speed is an important factor. At present, since the yield of produced chips largely depends on the redundant efficiency of the memory cells with the use of the redundant circuit, it is desirable to employ as many redundant word lines or bit lines as possible to improve the yield.

However, the conventional architecture requires one address conversion circuit for the replacement of one word or bit line, which greatly affects the chip area. Furthermore, it is impossible in practice to prepare a large number of redundant word or bit lines. In actual practice, only two to four redundant word or bit lines are employed for 512 to 1,024 word or bit lines, which does not provide a sufficient redundancy efficiency. Since no means is provided for invalidating a work or bit line that is not recovered by a redundant one, the existence of only one such a word or bit line will cause the entire chip to be discarded as defective.

Published Unexamined Japanese Patent Application No. 2-292798 discloses an error correction algorithm in which redundant cells and a means for replacing either one or else two or more defective cells with a corresponding number of redundant cells are provided to correct for errors that occur when a cell array of a flash EEPROM includes defective cells. The cell array is divided into a plurality of sectors, and the cells are erased en bloc on a sector basis; each cell cannot be erased individually. The redundant cells are provided in the same sector as the defective cells that are to be replaced with the redundant cells. Furthermore, a defect map for storing defect pointers for associating addresses of defective cells with those of redundant cells is also provided in the same sector as the defective cells.

Simply employing this type of memory chip configuration will cause a problem in that the information contained in the defect map is also lost at the time of sector erasure. Moreover, cases in which a defect exists in the area of the defect map cannot be accommodated, which may cause miscorrection. An error correction code (ECC) is usually employed to protect the defect map. However, when an ECC serves an entire sector, sufficient performance will not be provided, and, above all, there are no redundant cells used.

In many conventional flash memories the entire chip is an erase unit. Even in flash memories in which small parts of a chip are made into erase units, respective erase units are connected to different word lines. The sharing of a word line by two physically separated erase units, which is proposed herein, is not known.

As described above, the problem of how to add an efficient redundant architecture to a memory chip is an important consideration that will directly influence production yield, and thus the production cost of the chip. Furthermore, in the present circumstances, in order to create a better redundant architecture, it is necessary to consider the entire system in addition to the inside of a chip.

SUMMARY OF THE INVENTION

An object of the present invention is to provide an efficient redundant architecture for a flash-erase-type nonvolatile semiconductor storage device, and a method capable of improving the efficiency of the entire device.

Another object of the invention is to provide an efficient method of distinguishing defective sectors and avoiding the use of those sectors in an external storage system employing a flash-erase-type nonvolatile semiconductor storage device.

The above-described objects can be attained by taking advantage of the fact that in a semiconductor external storage system the inside of a sector is accessed serially. That is, memory cells on a word line of a flash-erase-type nonvolatile semiconductor storage device are associated with a sector of a semiconductor external storage system, and all the memory cells on that word line are activated every time the sector is accessed. The term "sector" includes the areas for storing system data such as ECCs. In addition to the data area, which is necessary for allowing the semiconductor external storage system to store user data, a tag area including areas for storing defective memory cell information and ECCs is connected to this word line. The data area and the corresponding tag area are activated at the same time, because they share the same word line. But they can be erased separately because they are formed in separate wells. That is, even when a data area is erased, the corresponding tag area is retained and the defective memory cell information and other data are not destroyed. Information in the tag area is written at the stage of the chip test that is performed after manufacture.

The system refers to this information at every access to the sector, thereby skipping defective memory cells. When the system detects an unrecoverable error, it writes predetermined data to the tag area to avoid subsequent access to that sector.

According to specific features of the invention, a flash-erase-type nonvolatile semiconductor storage device is constituted so that a memory cell array is physically divided into a data area and a tag area with shared word lines, and so that those two areas can separately be erased en bloc. The data area and the tag area that share one word line constitute a single logical unit, within which the tag area stores location information about defective memory cells in the corresponding data area. According to this information, the system performs the operation of avoiding the use of the defective memory cells. The defective memory cell information is programmed in a test step that is performed after chip manufacture, and, at the same time, ECCs for the defective memory cell information are generated and written to the tag area. Furthermore, by writing predetermined data to the tag area, the system is informed that the data area sharing the word line with the tag area is invalid. Even when the data area is erased en bloc, the data in the tag area are not erased and the defective memory cell location information is retained.

DETAILED DESCRIPTION OF THE PREFERRED EMBODIMENT

Figure 1:
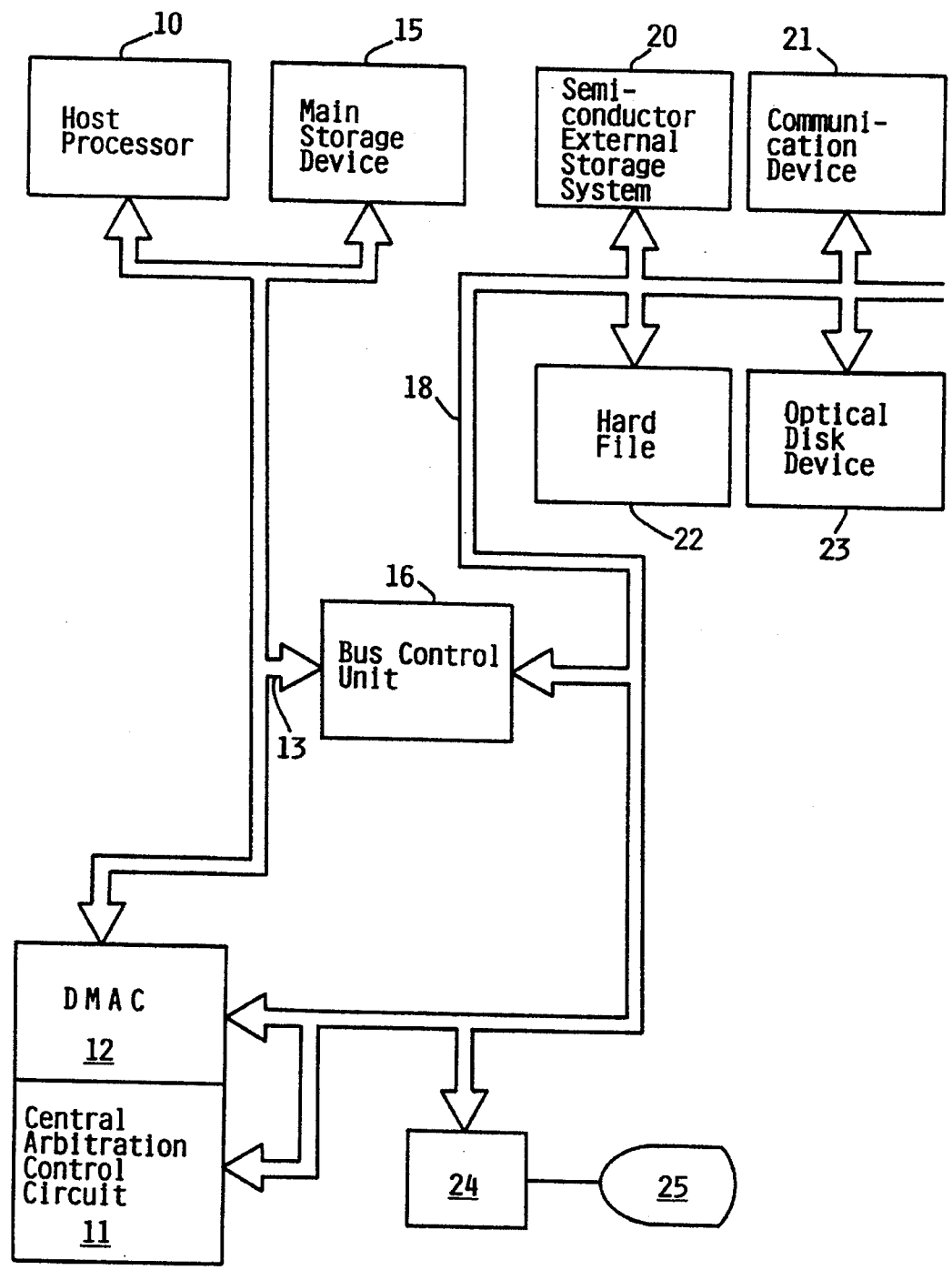
FIG. 1 is a diagram showing an example of a computer system incorporating a semiconductor external storage system of according to the present invention.

FIG. 1 shows an example of a computer system incorporating a semiconductor external storage system. Host processor 10 communicates with main storage device 15 and bus control unit 16 via system bus 13. Communications between processor 10 and the related peripheral devices are performed via bus control unit 16. To this end, bus control unit 16 is connected to the peripheral devices via family bus 18. Connected to family bus 18 as peripheral devices are external storage system 20 that is a flash memory (flash EEPROM) according to an embodiment of the present invention, communication device 21, hard file 22, and optical disc 23. Numeral 24 represents a display controller, and 25 represents a CRT. Of course, other peripheral devices can also be connected. This type of computer system is provided by, for instance, an IBM PS/2 personal computer.

Direct memory access control unit (DMAC) 12 is provided to enable memory access to all of the peripheral devices or to selected ones. To this end, at least part of family bus 18 is branched and connected to DMAC 12. Each peripheral device capable of DMA access is provided with an arbitration circuit (not shown) and assigned an arbitration level (priority). Adjacent to DMAC 12, central arbitration control circuit 11 is provided to perform arbitration among a plurality of peripheral devices concurrently requesting DMA access, and informs DMAC 12 which peripheral device has been granted DMA access. For details of DMA control by DMAC 12 and central arbitration control circuit 11, reference is made to U.S. Pat. No. 4,901,234.

Figure 2:
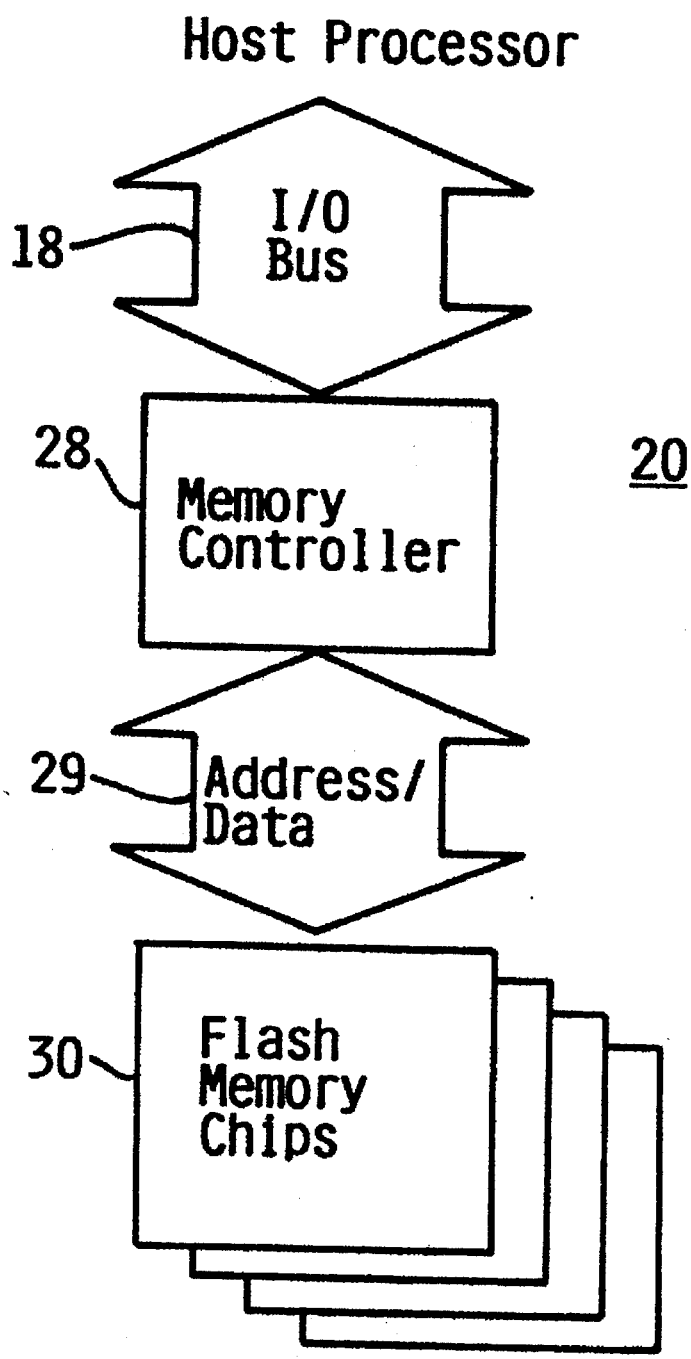
FIG. 2 is a drawing showing an example of a hardware configuration of the semiconductor external storage system according to the invention.

FIG. 2 shows the hardware configuration of semiconductor external storage system 20, which includes controller 28 connected to family bus 18 and one or more flash memory chips 30 connected to semiconductor memory bus 29. Controller 28 has a processor, a ROM for storing programs to be executed by the processor, and a RAM for temporarily storing data. Usually, controller 28 and flash memory chips 30 controlled by controller 28 are mounted on the same circuit board.

Figure 3:
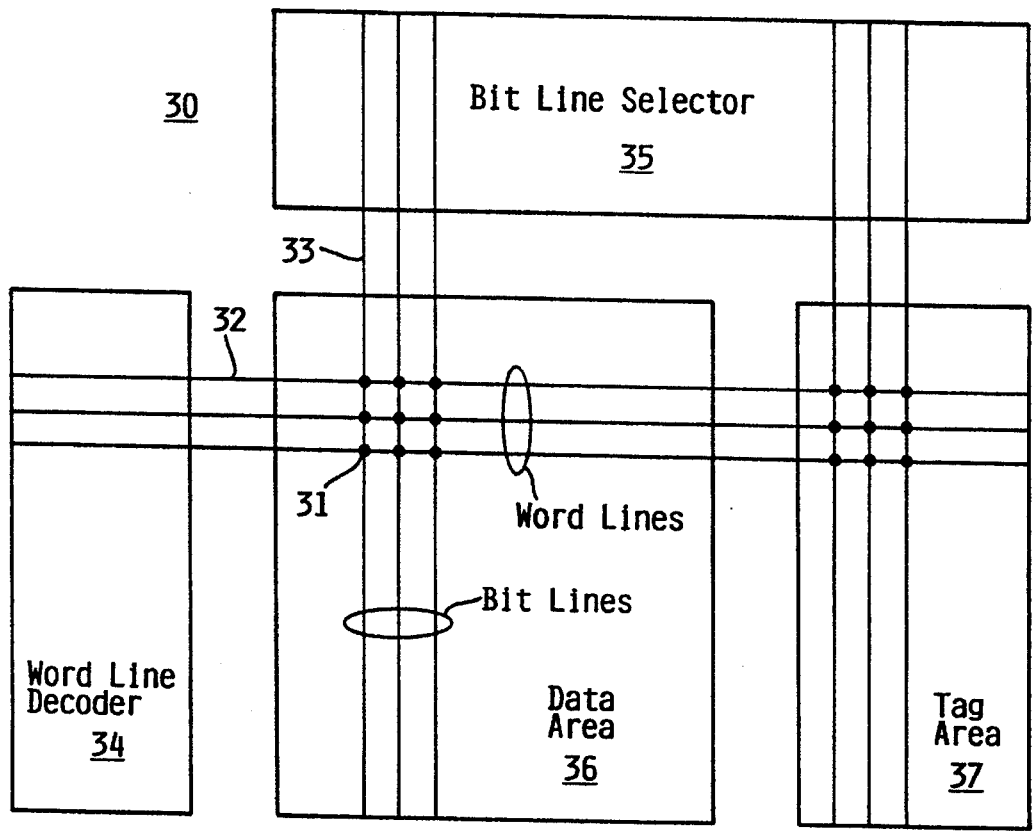
FIG. 3 is a drawing outlining a configuration of a flash memory chip according to an embodiment of the invention.

FIG. 3 outlines the configuration of flash memory chip 30, which consists of an array of memory cells 31 that can be selected by word lines 32 and bit lines 33, and peripheral circuits including word line decoder 34 and bit line selector 35. The array of memory cells 31 is physically divided into data area 36 and tag area 37 so that those two areas can be erased separately. Word lines 32 are shared by data area 36 and tag area 37. FIG. 3 shows one set of a data are and a tag area, but there may be a plurality of sets in a single chip 30.

Figure 4:
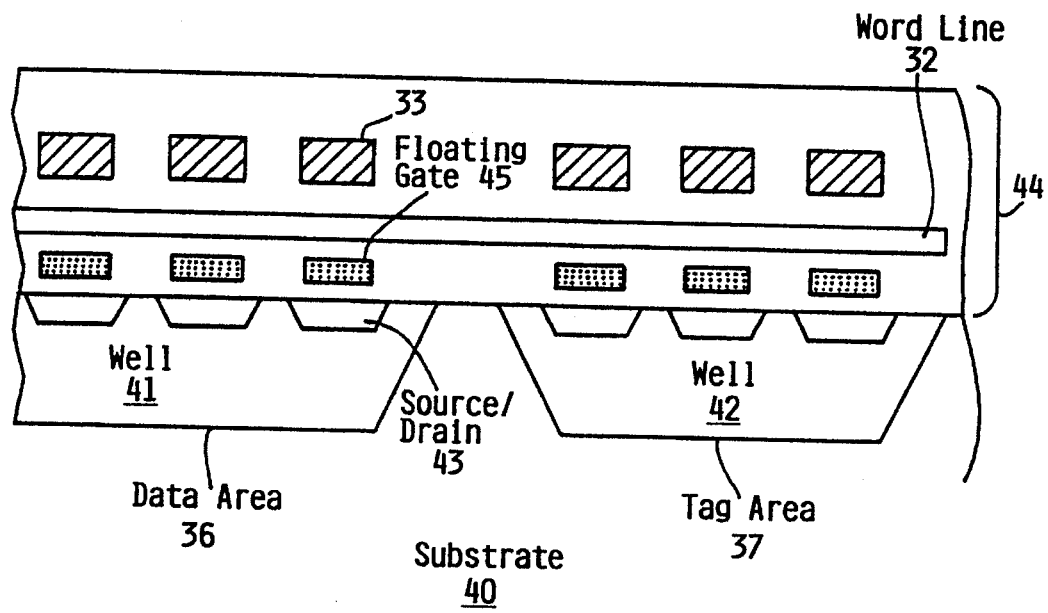
FIG. 4 is a schematic sectional view in the word line direction of a memory cell array.

FIG. 4 schematically shows a cross-section of the memory cell array in the word line direction. Substrate 40 is N-type silicon. Separate erasure and programming on data area 36 and tag area 37 are realized by physically separating P-type wells 41 and 42 for the respective areas. Since P-type wells 41 and 42 are also separated electrically, voltages applied thereto can be determined separately. Source/drain regions 43 of the respective memory cells are heavily doped N+-type regions. Floating gates 45, word lines 32, and bit lines 33 are buried in silicon dioxide layer 44 covering substrate 40. Floating gate 45 is made of N+-type polysilicon, word line 32 is made of N+-type polysilicon or metal, and bit line 35 is made of metal. The structure of FIG. 4 can be produced by known integrated circuit manufacturing technologies.

Programming memory cell 31 means accumulating an electron charge in floating gate 45, and erasing it means discharging floating gate 45. The state in which a charge is accumulated in floating gate 45 is called a logical "0" and the discharged state is called a logical "1."

There are various types of flash memory. A NAND-type flash memory is described hereinafter, and Table 1 shows an example of operating voltages for a memory cell in which Fowler-Nordheim (F-0N) tunneling is used for both data erasure and writing.

Table 1

Erasure
  Well: 15 V
  Source/drain: 15 V (same voltage as the well)
  Word line: 0 V—Writing
  Well: 0 V
  Source/drain: 0 V/8 V (depending on write data)
  Word line: 15 V Referring to FIG. 4, at the time of erasure, electrons are discharged from floating gate 45 to source/drain 43 and well 41 or 42 by applying a strong electric field in the direction from well 41 or 42 toward word line 32. To write a logical 0, electrons are transferred to floating gate 45 by applying a strong electric field in the direction from word line 32 toward well 41 or 42. To write a logical 1, a weak electric field is applied; this avoids electron transfer to floating gate 45. In this case, a voltage of 8 V, rather than 15 V, is applied to source/drain 43 to prevent leakage (junction breakdown) from source/drain 43 to well 41 or 42.

A mode in which the data in tag area 37 are retained while data area 36 is either erased or has data written to it is called a protect mode. When data area 36 is erased in the protect mode, the same voltage as applied to word line 32 is applied to source/drain 43 and well 42 of memory cells 31 in tag area 37 (see Table 2 below) to prevent the occurrence of disturbance (data destruction) in tag area 37.

Table 2

Protect mode/Data area erasure
  Well: 0 V
  Source/drain: 0 V
  Work line: 0 V

When data area 36 is written to in the protect mode, the operating voltages of tag area 37 may be set according to one of the two methods shown in Table 3. According to the first method, a logical value of 1 is written to an area of a data buffer (described later) that corresponds to tag area 37, so that 8 V is applied to source/drain 43. According to the second method, the same voltage as applied to word line 32 is applied to source/drain 43 and well 42. In either method, disturbance in tag area 37 can be avoided. The first method is preferable from a practical viewpoint because the well voltage of tag area 37 is equal to that of data area 36, and control is thereby simplified.

Table 3

Figure 5:
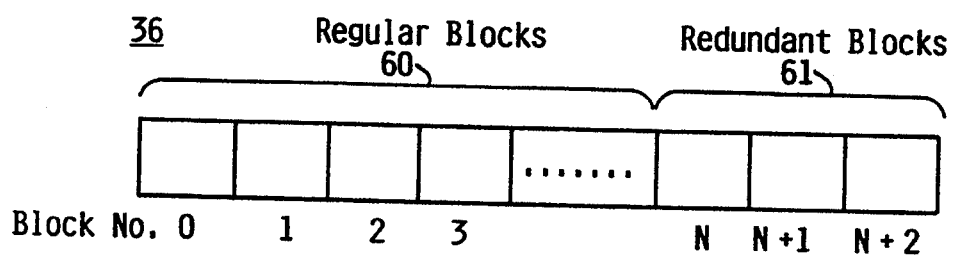
FIG. 5 is a circuit diagram including a memory controller and the flash memory chip.

Protect mode/Data area writing
  Method 1
    Well; 0 V
    Source/drain: 8 V
    Word line: 15 V
  Method 2
    Well: 15 V
    Source/drain: 15 V
    Word line: 15 V FIG. 5 is a circuit diagram showing circuits of memory controller 28 and flash memory chip 30 of FIG. 2. Memory controller 28 has command processor 281 and I/O buffer 282. Flash memory chip 30 is of the NAND type, and n memory cells 311–31n are connected in series to a single bit line 32 via select gates 50 and 51. Therefore, the source/drain voltage becomes equal to the voltage of the bit line to which memory cells 311–31n are connected. Since the NAND-type flash memory itself is disclosed in, for instance, "A NAND Structure Cell with a New Programming Technology for Highly Reliable 5 V-Only Flash EEPROM," 1990 Symposium on VLSI Technology, pp. 129–130, its structure is described here only briefly.

Control gates of memory cells 311–31n are electrically connected to output terminals CG1–CGn of a word line decoder 34 via word lines 321–32n, respectively. Voltages are applied to control gates of the select gates 50 and 51 from output terminals SG1 and SG2 of the word line decoder 34, respectively. A bit line 33 is selected by a bit line selector 35 consisting of an address decoder 351, a data buffer 352, and a bit switch 353. While in FIG. 5 only a single set of two select gates and n memory cells is connected to one bit line 33, a plurality of sets may be connected to one bit line.

The most important feature of this embodiment is that the memory cell array is divided into two groups (a data area and a tag area) which are formed in separate wells. Voltages to be applied to wells 41 and 42 are set independently by separate well switches 52 and 53, respectively. The data area and the tag area sharing one word line constitute a single logical unit. In the following description, it is assumed that one logical unit corresponds to one sector. However, a plurality of logical units may be combined as a sector, or, conversely, a plurality of sectors may be combined as a logical unit, and the invention can also be applied to such cases.

Receiving a command from I/O bus 18, command processor 281 decodes an instruction code and sends a status A signal to word line decoder 34, bit switch 353, well switches 52 and 53, and I/O buffer 282 via bus 29. On the basis of the status A signal, word line decoder 34 performs an erase operation in a protect mode or non-protect mode, a write operation in a protect mode or non-protect mode, or a read operation.

On the basis of address information included in a read or write command, command processor 281 generates an address A signal for selecting the word line, and sends it to word decoder 34. Furthermore, command processor 281 generates a signal for indicating an address B in data buffer 352, and sends it to address decoder 351.

Voltages of 0 V, 5 V, 8 V and 15 V are supplied to word line decoder 34 from outside the chip. On the basis of the status A signal and the address A signal that are sent from command processor 281, word line decoder 34 determines the voltages to be output from terminals SG1, CG1–CGn, and SG2.

Voltages of 0 V, 5 V and 8 V are supplied to bit switch 353 from outside the chip. On the basis of the status A signal from command processor 281 and the data stored in data buffer 352, bit switch 353 determines the voltages to be applied to the respective bit lines.

Read or write data are transferred between I/O bus 18 and data buffer 352 via I/O buffer 282 and address decoder 351. Switching between read and write in I/O buffer 282 is performed on the basis of a status B signal sent from command processor 281.

Voltages of 0 V and 15 V are supplied to well switches 52 and 53 from outside the chip. ON the basis of the status A signal from command processor 281, well switches 52 and 53 determine the voltages to be applied to wells 41 and 42.

In short, according to the command from the I/O bus, command processor 281 controls word line decoder 34, bit line selector 35, and well switches 52 and 53 by means of the status A signal and the address A signal, and sets operating voltages that are suitable for the execution of appropriate commands for the memory cells. Table 4 shows the voltages that are set with respect to flash memory chip 30 in the non-protect-mode erasure.

TABLE 4

| SG1 | CG1–CGn | SG2 | Bit lines (all) | Wells (both) |
|---|---|---|---|---|
| 0 V | 0 V | 0 V (5 V) | 15 V | 0 V |

When all the word lines are at 0 V and 0 V is output at terminals SG1 and SE2, all sources/drains 43 are placed in a floating state and, therefore have the same voltage as well 41 or 42, that is, 15 V. In this case, since select gate 50 prohibits the voltages supplied to the bit lines from actually being applied to the cells, the bit lines may be supplied with either 0 V or 5 V. With the above operations, a strong electric field is applied to all the memory cells of data area 36 and tag area 37 in the direction from source/drain 43 and well 41 or 42 toward word line 32, and en-block erasure of data is performed.

In an erasure in the protect mode, as in the non-protect mode, 0 V is output at terminals SG1 and SG2, and therefore all sources/drains 43 are placed in a floating state so that they have the same voltage as well 41 or 42. Well switch 53 for tag area 37 supplies 0 V to well 42 (see Table 5).

TABLE 5

| SG1 | CG1–CGn | SG2 | Bit lines (Data area) | Well (Data area) |
|---|---|---|---|---|
| 0 V | 0 V | 0 V (5 V) | 0 V | 0 V (5 15 V) |
| | | | Bit lines (Tag area) | Well (Tag area) |
| 0 V | | | 0 V (5 V) | |

Since no electric field is applied to the memory cells of tag area 37 in the direction from source/drain 43 toward the word lines, data in those cells are retained.

Next, a data write operation is described on the assumption that method 1 of Table 3 is used in the protect mode. Data to be written to data area 36 is sent from I/O bus 18 to data buffer 352 via I/O buffer 282 and address decoder 351, and temporarily stored therein. If the statue id data write, bit switch 353 supplies bit lines 32 with the corresponding bit data of data buffer 352. That is, bit switch 353 supplies 0 V to bit lines 32 if the write data has the logical value 0, and 8 V if it has the logical value 1. Word line decoder 34 decodes the address A signal, and supplies 15 V to the word line of the write-subject sector and 8 V to the other word lines. Well switches 52 and 53 switch the voltages for wells 41 and 42 to 0 V, respectively.

Table 6 shows the voltages that are set with respect to flash memory chip 30 in a non-protect-mode write to the sector sharing word line 321.

TABLE 6

| SG1 | CG1 | CG2–CGn | SG2 | Bit lines (All) | Wells (Both) |
|---|---|---|---|---|---|
| 0 V/8 V (depending on write data) | 8 V | 15 V | 8 V | 0 V | 0 V |

A strong electric field is applied to the memory cells that have write data with a logical value 0, in the direction from the word line toward source/drain 43, and programming is effected there. Since a weak electric field is applied to the memory cells that have write data with a logical value 1, no programming occurs there.

In a protect-mode write operation, a logical value 1 is written in advance to the area of data buffer 352 that corresponds to tag area 37, so that bit switch 353 supplies 8 V to bit lines 32 of tag area 37 (see Table 7).

TABLE 7

| SG1 | CG1 | CG2–CGn | SG2 | Bit lines (Data area) Wells (Data area) |
|---|---|---|---|---|
| 0 V/8 V (depending on write data) | 8 V | 15 V | 8 V | 0 V 0 V |
| | | | | Bit lines (Tag area) Wells (Tag area) |
| | | | | 8 V 0 V |

A low voltage is applied to the memory cells of tag area 37 from source/drain 43 toward the word line, and data retained there.

Next, the read operation is described. When the status is data read, bit switch 353 supplies all bit lines 32 with a voltage (5 V) for reading data. Furthermore, word line decoder 34 decodes the address A signal, and supplies 0 V to the word line corresponding to the read subject sector and 5 V to the remaining sectors. Table 8 shows the voltages that are set with respect to flash memory chip 30 while data are being read from the sector sharing word line 321.

TABLE 8

| SG1 | CG1 | CG2–CGn | SG2 | Bit lines (All) | Wells (Both) |
|---|---|---|---|---|---|
| 5 V | 0 V | 5 V | 5 V | 5 V | 0 V |

Depending on whether the data of the memory cell have a logical value 0 to 1, a signal of 0 V or 5 V appears at the location of the corresponding bit of data buffer 352. The data read from data area 36 are output to I/O bus 18 via address decoder 351 and I/O buffer 282.

The logical division of data area 36 is described with reference to FIG. 6. The memory cells of data area 36 that share a word line, that is, those that belong to the same sector, are logically divided into a plurality of blocks. Block numbers are assigned to the respective blocks. One block consists of, for example, eight memory cells. Data area 36 includes several redundant blocks 61 for replacement, in addition to blocks (regular blocks) 60 normally used for data storage. In the example shown in FIG. 6, three redundant blocks 61 are provided.

Figure 7:
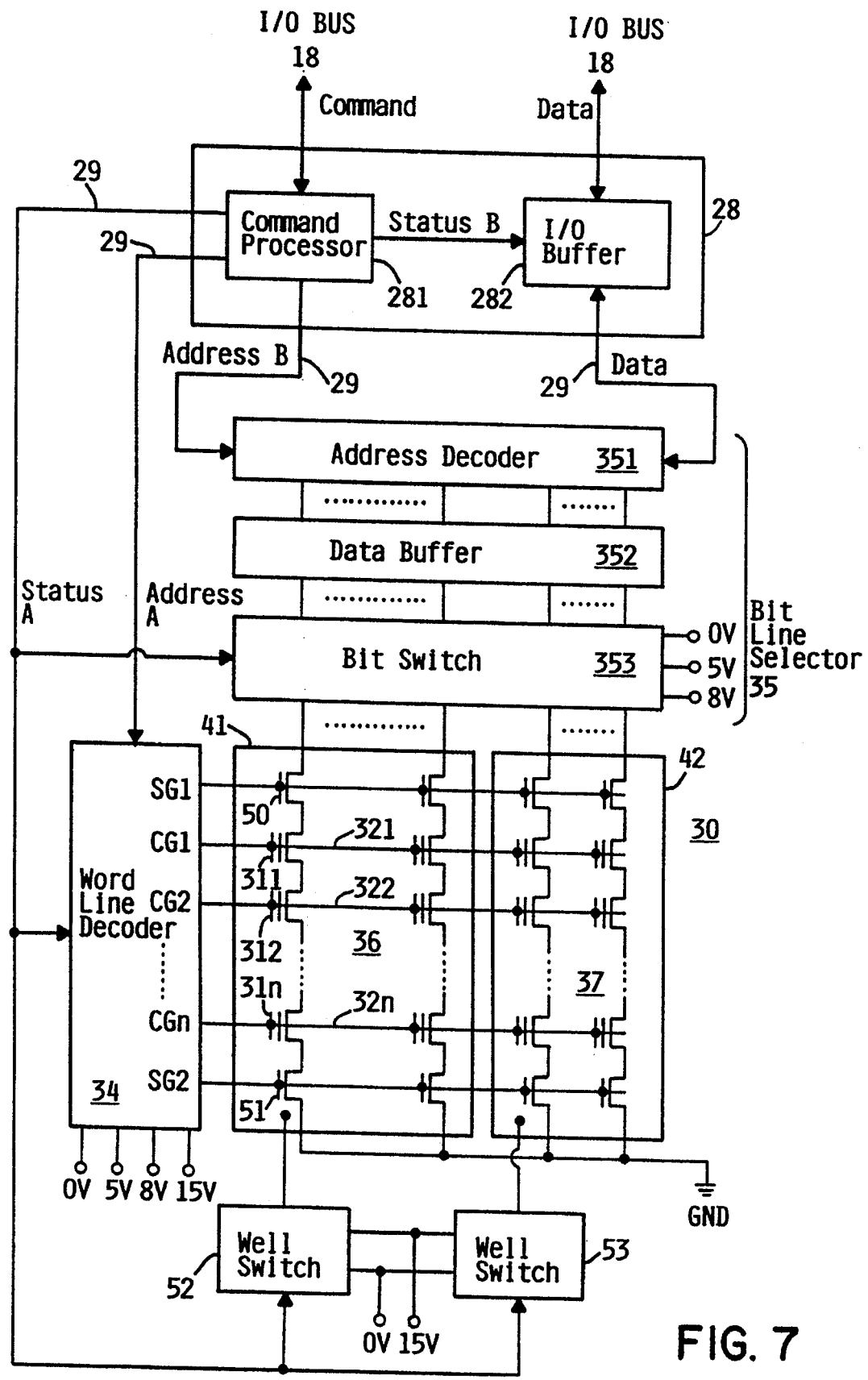
FIG. 7 is a drawing showing an example of logical division of a tag area.

As shown in FIG. 7, tag area 37 in the sector is also logically divided. Defective block number storing area 62 corresponding to the number of redundant blocks 61, replacement block number storing area 63, and area 64 for storing ECCs for all areas 62 and 63 in the sector are secured. One set of defective block number storing area 62 and replacement block number storing area 63 is called a defect information area. The sizes of areas 62, 63, and 64 are set at, for example, 9 bits, 2 bits, and 16 bits, respectively.

Figure 6:
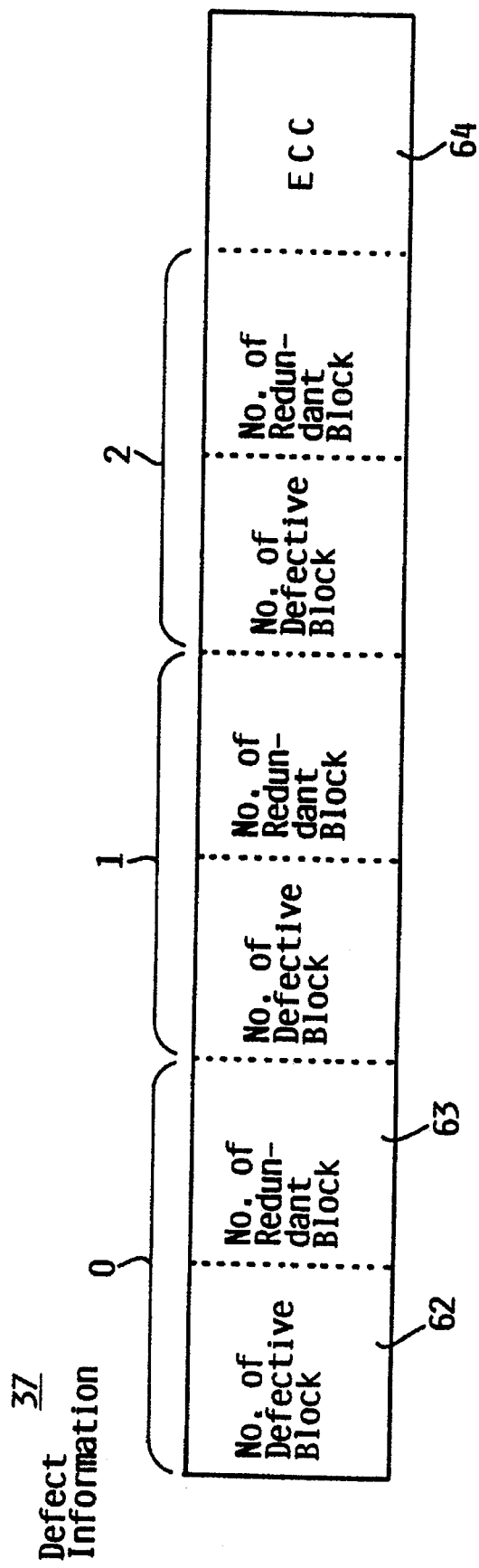
FIG. 6 is a drawing showing an example of logical division of a data area.

A result of the logical division shown in FIGS. 6 and 7 is that the initial test and the data read and write operations on the memory chip according to the invention are unique. Procedures for the initial test and the data write and read operations are described below in detail, using flow charts.

Figure 8:
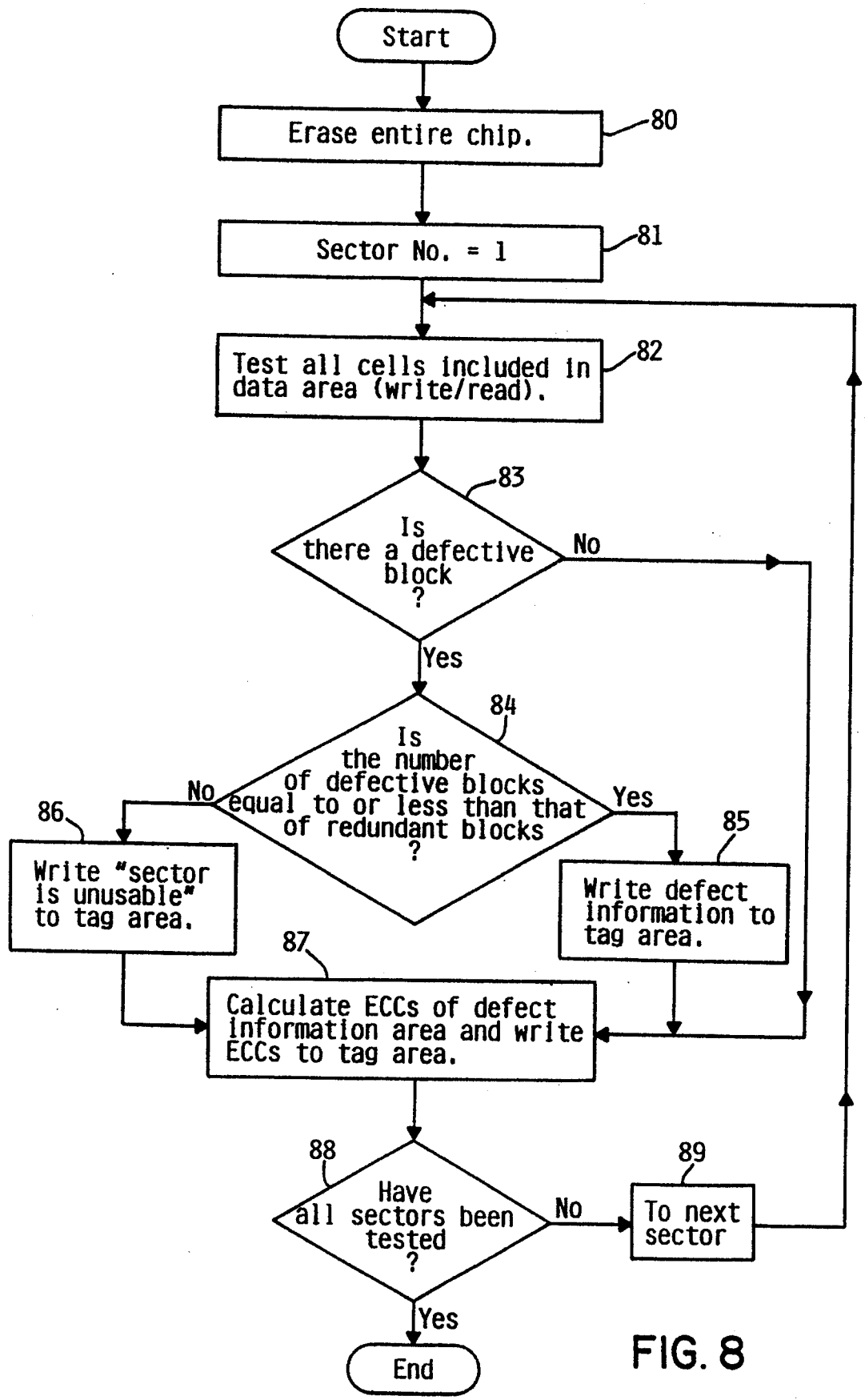
FIG. 8 is a flowchart showing a step of an initial test performed after chip manufacture.

FIG. 8 shows an initial test step performed after chip manufacture. On receiving a test command from host processor 10, memory controller 28 executes an initial test program, including the steps shown in FIG. 8, prepared in the internal ROM or in the system (at the level shown in FIG. 1).

First, the entire chip is erased (step 80). Thereafter, data area 36 is tested. All the blocks of data area 36 belonging to sector 1 are tested (steps 81 and 82). More specifically, test data are written to and then read from memory cells of all the blocks. If a block includes one or more defective cells, it is judged to be defective.

As shown in FIG. 5, an address within the sector of the memory cell is given as address B. How, if it is assumed that the length of address B is M bits and that the number of cells included in one block is a Kth power of 2, then the block number that includes a certain memory cell is given as the upper (M–K) bits of the address B of that cell.

When defective blocks are found in data area 36, the number of defective blocks and the number of redundant blocks are compared (steps 83, 84). If the former is equal to or less than the latter, the defective block numbers are registered in defective block number storing area 62 of tag area 37 that shares the same word line. At the same time, non-defective redundant blocks are assigned to the defective regular blocks, and their numbers are registered in replacement block number storing area 63 (steps 84 and 85). If, in the example of FIG. 6, the seventh block of data area 36 is judged to be defective and the (N+r)th redundant block is assigned thereto as a replacement block, "7" is written to defective block number storing area 62 and "r" is written to replacement block number storing area 63 of the 0th defect information area.

If the number of defective blocks exceeds that of redundant blocks, then either data that will cause an unrecoverable ECC error to occur or else a special value (for example, all the cells may be given the logical value 0) is written to tag area 37, to register the fact that the data area 36 sharing that word line is unusable (steps 84, 86).

After data area 36 has been tested, ECCs are generated for the entire defect information area associated with the same word line, and written to ECC storing area 64 (step 87). Steps 82–87 are repeated until all the sectors have been tested (steps 88 and 89).

Figure 9:
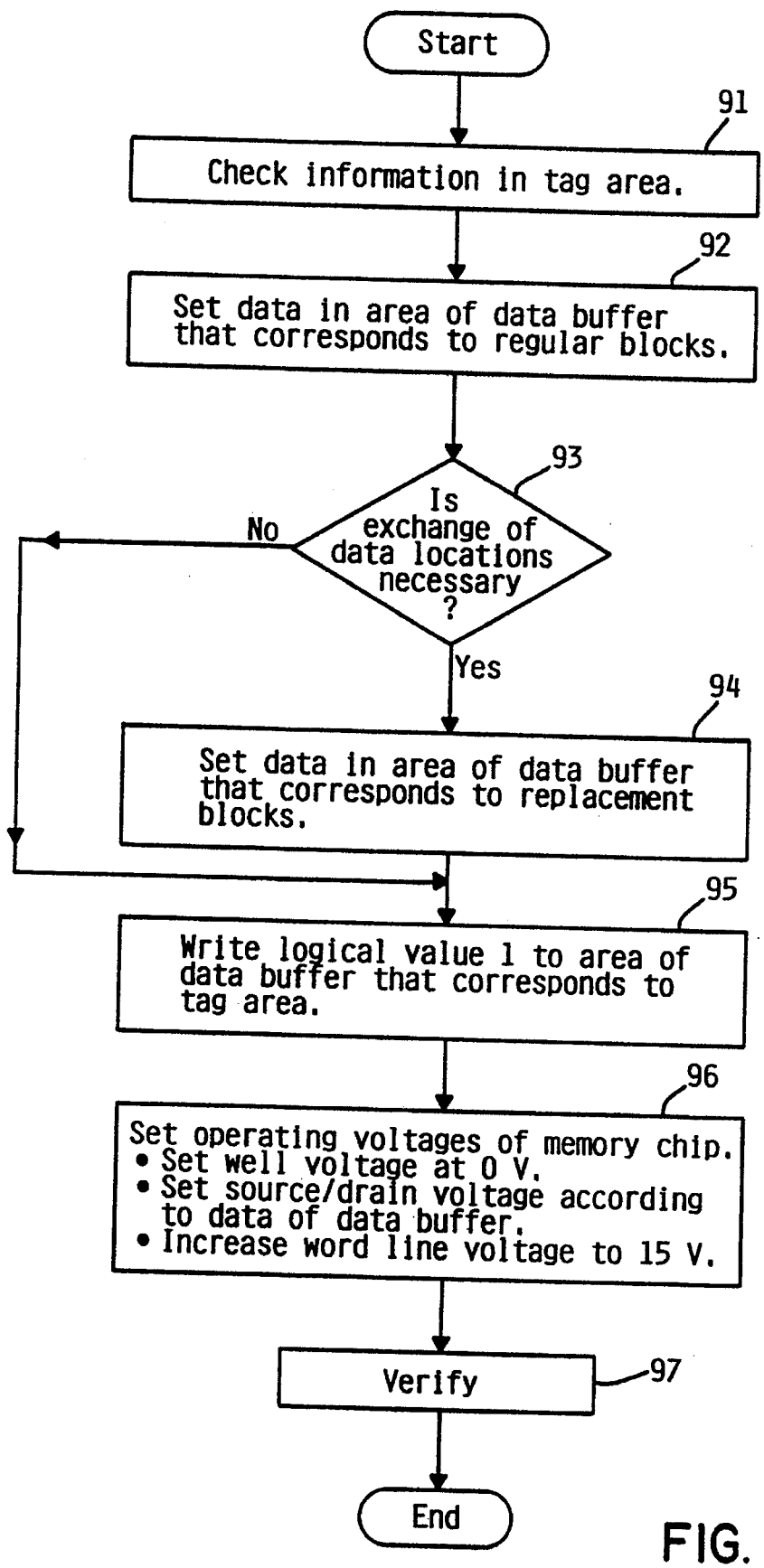
FIG. 9 is a flowchart showing a step of a data write operation of a protect mode.

FIG. 9 shows the steps for the data write operation in the protect mode. On receiving a write command from host processor 10, memory controller 28 reads the information of the sector of tag area 37 specified by the write command and extracts the defective block numbers while, if necessary, correcting the tag data based on the ECCs, before setting the operating voltages of memory chip 30 (step 91). Then, memory controller 28 sets the data of I/O buffer 282 in the area of data buffer 352 that corresponds to the regular blocks (step 92). If one or more regular blocks are defective and exchange of data locations is therefore needed, the data are set in the area of data buffer 352 that corresponds to the replacement blocks (steps 93 and 94). After the data to be written to data area 36 have been set, memory controller 28 writes a logical value 1 to the area of data buffer 352 that corresponds to tag area 37 (step 95). After the data to be written to data buffer 352 have been set, memory controller 28 sets the operating voltages of memory chip 30 as shown in Table 7, in accordance with the status and address specified by the write command (step 96).

After the write operation, memory controller 28 performs a program verification operation on the regular blocks not registered as defective blocks (step 97). If an error occurs even after a predetermined number of verify operations, part of data area 36 associated with that word line is judged unusable from that time on. In order to register this fact, memory controller 28 writes either data that will cause an unrecoverable ECC error or else a special value (for example, all the cells may be given the logical value 0) to tag area 37. In this case, a new work line is selected, and the data write operation is started over again.

Figure 10:
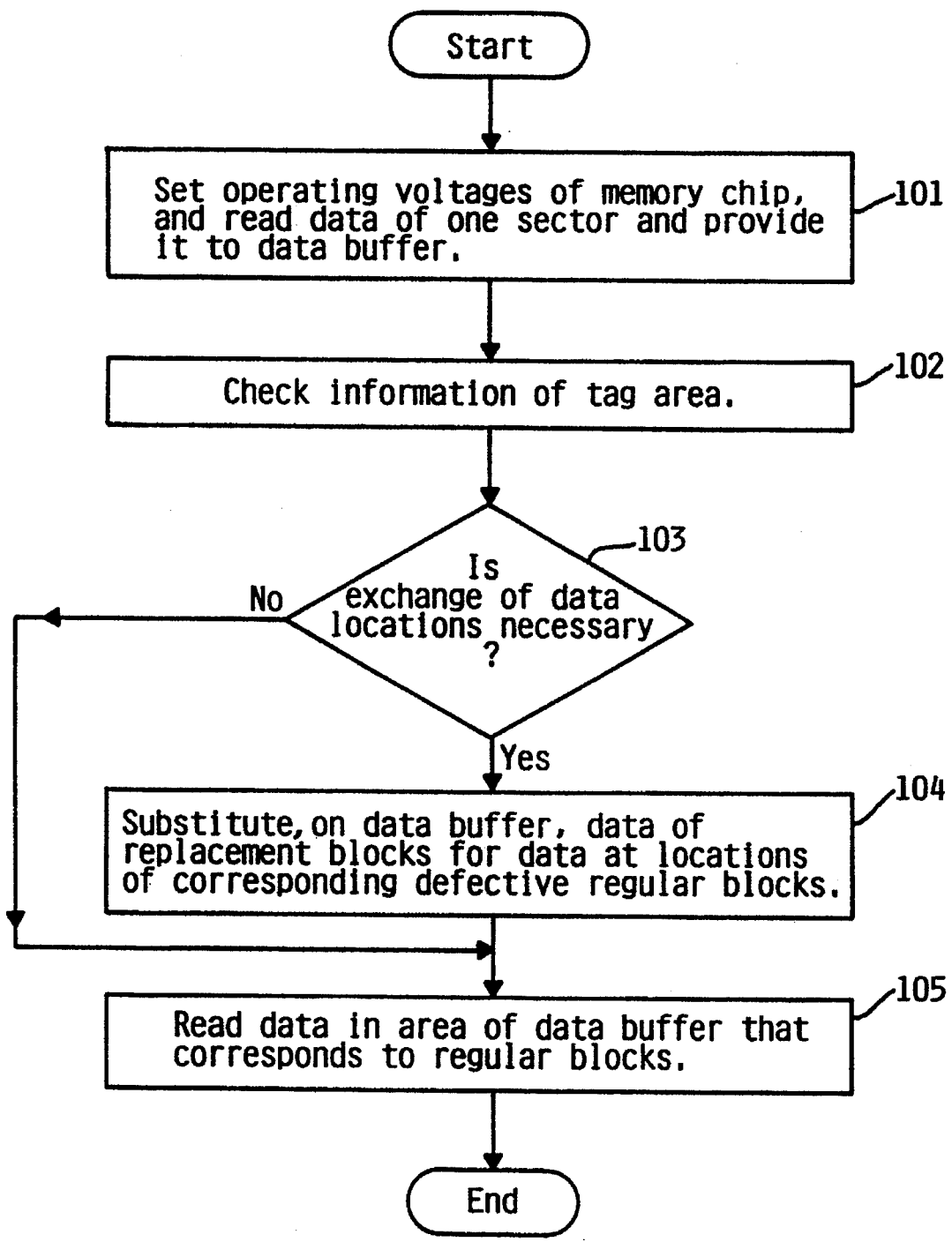
FIG. 10 is a flowchart showing a step of a data read operation.

FIG. 10 shows the steps of the data read operation. On receiving a read command from host processor 10, memory controller 28 sets the operating voltages of memory chip 30 as shown in Table 8, and reads the data of one sector, that is, the data of data area 36 and tag area 37, to data buffer 352 (step 101). Then, memory controller 28 reads the information of tag area 37 from data buffer 352, and extracts the defective block numbers while, when necessary, correcting the tag data on the basis of the ECCs (Step 102). If one or more regular blocks are defective and therefore exchange of data locations is needed, the data of the replacement blocks are substituted, on data buffer 352, for the data at the locations of the corresponding defective regular blocks (steps 103 and 104). After the exchange of data locations, memory controller 28 reads the data in the area of data buffer 352 that corresponds to the regular blocks (step 105).

Figure 11:
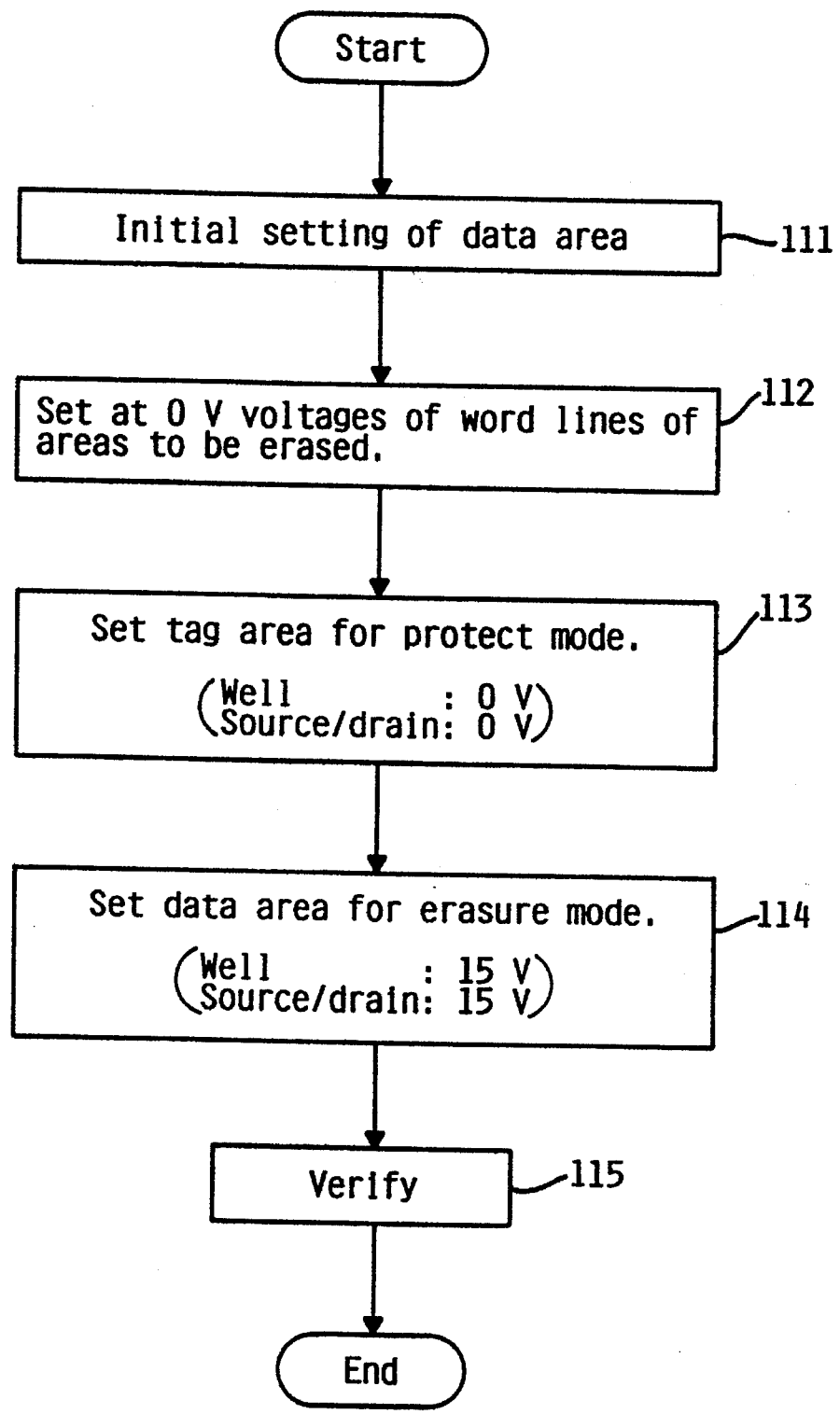
FIG. 11 is a flowchart showing a step of an erase operation in the protect mode.

FIG. 11 shows the steps of the erase operation in the protect mode. On receiving an erase command in the protect mode from host processor 10, memory controller 28 first executes an initial setting program for data area 36 stored in the ROM (step 111). Next, memory controller 28 sets the voltages of the word lines of the areas to be erased to 0 V (step 112). Then, after tag area 37 has been set to the protect mode, data area 36 is set to the erase mode (steps 113 and 114). Then, a verify operation similar to that of step 97 of FIG. 9 is performed (step 115). Since in the erase operation all the memory cells in a certain area are erased, no defect information or replacement information is used.

Depending on the memory cell structure, it is necessary to make all cells have a logical value of 0 before erasure. When cells of this type are used, an operation for making all cells have a logical value of 0 (that is, reprogramming) is performed before erasure. Such an operation is performed in step 61.

The main operations with respect to memory chip 30 are described above. As another operation, in cases where the system (of the level of FIG. 1) that includes memory chip 30 has ECCs added for the data and in which ECC errors occur at the system level, data area 36 that has so far stored that data is judged to be unusable. To register this fact either data that will cause an unrecoverable FCC error or else a special value (for instance, all the cells may be given the logical value 0) is written to tag area 37 that shares the word line. In this case, a new word line is selected, and correct data are written to data area 36 associated with that word line.

When the flash memory is employed as a semiconductor external storage system 20, a sector management information table is prepared that stores information such as validity/invalidity on a sector-by-sector basis. According to the flash memory of the invention, tag area 36 associated with all the related word lines is scanned at the time of the initial setting (formatting) and at the time of reconstruction of the sector management information, which is performed after the flash erasure, and data area 36 sharing the word line with tag area 37 in which an ECC error has occurred is made unusable, and the remaining data areas 36 are registered in the sector management information table as sectors in use.

Although the invention is described above by way of a specific embodiment, the invention is not limited to this embodiment but can be executed in various forms. For example, while the flash memory of the embodiment is of the NAND type, the invention can also be applied to the NOR-type flash memory. In the case of the NOR-type memory, the data area alone can be subjected to flash erasure by separating the wells for the data area and the tag area and applying different voltages to those wells.

Furthermore, the defective block numbers alone may be registered in the tag area without providing a replacement block number storing area in the tag area. In this case, the block adjacent to a defective block (that is, the block having the block number plus one) is employed as a replacement block. Therefore, in a data write operation, programming is performed on a block-by-block basis while skipping defective blocks. In a data read operation, data is read on a block-by-block basis while skipping defective blocks, and the read out data are sent to the data buffer and then transferred to the I/O bus.

The advantages provided by the invention may be summarized as follows:

(1) Since every word line has redundant blocks (redundant blocks 61 of FIG. 6) used exclusively for that word line, the redundancy efficiency of the memory cells is greatly improved. That is, it is expected that the redundancy efficiency amounts to the equivalent of that obtained in the case where every word line has a single redundant word line.

(2) Since a data area and a tag area share a word line, the tag area can be activated at the same time as the data area. That is, an address conversion circuit for making the redundant blocks effective is not required. Therefore, the influence on the chip area is very small for a highly redundant efficiency.

(3) ECCs to remedy defective cells in the data area are added only to the defect information area, which has a small data quantity, rather than to the data area itself. Therefore, the quantity of ECCs can be relatively small, and the ECC overhead can be reduced.

(4) Since a data area and a tag area share a word line, a series of tags and data are consecutively accessed in what is called a page mode, which enables high-speed access.

(5) Since a data area and a tag area are physically connected, no overhead processing is needed to associate the two areas.

(6) When a flash-erase type nonvolatile semiconductor storage device is used in an external storage system, it is highly suited to the serial data I/O method whose use is likely to increase.

(7) The tag area can be used for storage of the sector management information of the external storage system, in addition to being used as part of the redundant architecture. Where the tag area is used in such a manner, system management can be performed safely and easily. That is, since the tag area is not erased at the time of en-bloc erasure of the data area, it is not necessary to copy the sector management information to another storage device, and it is well protected against accidental power-down.

Furthermore, since the tag area stores part of the sector management information, when flash-erase-type nonvolatile semiconductor memories are used as element elements of an external storage system, it is not necessary to keep track of all the valid cells included in each memory. For example, a 4-megabit chip need not have precisely 4 megabits; some excess or shortage is permitted. The difference in the number of bits is absorbed by redundant sectors included in the external storage system. As a result, manufactured chips can be used efficiently.

As described above, according to the invention, defects in the flash-erase-type nonvolatile semiconductor storage device can be remedied efficiently.

What is claimed is:

1. A nonvolatile semiconductor storage device with a flash erase capability comprising at least one array of memory cells whose operating voltages are supplied by means of word lines and bit lines, wherein memory cells sharing a word line are grouped into a first set and a second set such that particular contents of data stored in the memory cells of said second set are maintained when data stored in the memory cells of said first set are erased en block by applying an electric field between the word line and the memory cells of the first set as a single voltage charge pulse to the memory cells of the first set, the memory cells of said first set are logically grouped into a plurality of blocks each consisting of a plurality of memory cells, those blocks include regular blocks that are usually employed for the storage of data and redundant blocks that are employed for block replacement, and the memory cells of said second set are employed to store data used for identifying defective regular blocks and redundant blocks that are employed as replacements thereof, and said second set is also employed to store error correction codes (ECCs) generated for said data used for identifying said defective blocks and said redundant blocks.

2. The semiconductor storage device of claim 1, wherein the memory cells of said second set are employed to store data indicating the unavailability of the memory cells of said first set.

3. A nonvolatile semiconductor storage device with a flash erase capability comprising at least one array of memory cells whose operating voltages are supplied by means of word lines and bit lines, wherein memory cells sharing a word line are grouped into a first set and a second set such that particular contents of data stored in the memory cells of said second set are maintained when data stored in the memory cells of said first set are erased en block by applying an electric field between the word line and the memory cells of the first set as a single voltage charge pulse to the memory cells of the first set, the memory cells of said first set are logically grouped into a plurality of blocks each consisting of a plurality of memory cells, those blocks include regular blocks that are usually employed for the storage of data and redundant blocks that are employed for blocks replacement, and the memory cells of said second set are employed to store data used for identifying defective regular blocks and redundant blocks that are employed as replacements thereof, and the memory cells of said second set are also employed to store error correction codes (ECCs) generated for said data used for identifying said defective blocks and said redundant blocks, and the memory cells of said second set are further employed to store data indicating the unavailability of the memory cells of said first set.

* * * * *